US006835464B2

(12) United States Patent
Ambrose et al.

(10) Patent No.: US 6,835,464 B2
(45) Date of Patent: Dec. 28, 2004

(54) THIN FILM DEVICE WITH PERPENDICULAR EXCHANGE BIAS

(75) Inventors: Thomas F. Ambrose, Mars, PA (US); Timothy John Klemmer, Pittsburgh, PA (US); Rene Johannes Marinus van de Veerdonk, Pittsburgh, PA (US); Gregory John Parker, Warrendale, PA (US); James K. Howard, Pittsburgh, PA (US)

(73) Assignee: Seagate Technology LLC, Scotts Valley, CA (US)

(*) Notice: Subject to any disclaimer, the term of this patent is extended or adjusted under 35 U.S.C. 154(b) by 112 days.

(21) Appl. No.: 10/251,278

(22) Filed: Sep. 19, 2002

(65) Prior Publication Data

US 2003/0228491 A1 Dec. 11, 2003

Related U.S. Application Data

(60) Provisional application No. 60/386,997, filed on Jun. 7, 2002.

(51) Int. Cl.$^7$ ................................................. H01F 1/00
(52) U.S. Cl. ....................... 428/611; 428/669; 428/675; 428/692
(58) Field of Search .......................... 428/611, 669, 428/675, 692

(56) References Cited

U.S. PATENT DOCUMENTS

| 5,308,788 A | * | 5/1994 | Fitch et al. ................... 117/86 |
| 5,528,440 A | | 6/1996 | Fontana et al. |
| 5,862,022 A | * | 1/1999 | Noguchi et al. ......... 360/324.2 |
| 6,134,090 A | | 10/2000 | Mao et al. |
| 6,480,411 B1 | * | 11/2002 | Koganei ..................... 365/158 |
| 2002/0135954 A1 | * | 9/2002 | Yoshikawa et al. .... 360/324.12 |

OTHER PUBLICATIONS

Zhu, J. G., Zheng, Y., and Liao, S., IEEE Trans. Mag., 37(4), 2001, 1723–1726.*

J.–P. Renard et al., "Inverse Giant Magnetoresistance (Invited)," *J. Appl. Phys.*, vol. 79, No. 8, Apr. 15, 1996, pp. 5270–5275.
G. Gubbiotti et al., "Antiferromagnetic Coupling in Perpendicularly Magnetized Ni/Cu/Ni Epitaxial Trilayers," *Journal of Magnetism and Magnetic Materials*, vol. 240, Feb. 2002, pp. 461–463.
S. A. Haque et al., "Transition of Magnetic Anisotropy in Ni/GaAs (001) Observed by Magnetization and Ferromagnetic Resonance," *Journal of Magnetism and Magnetic Materials*, vol. 247, May 2002, pp. 117–126.
W. H. Meiklejohn et al., "New Magnetic Anisotrophy," *Physical Review*, vol. 102, No. 5, Jun. 1, 1956, pp. 1413–1414.
J. K. Howard et al., "Characterization of FeMn(N)/FeMn/Permalloy Exchange Coupled Structures," *J. Appl. Phys.*, vol. 64, No. 10, Nov. 15, 1988, pp. 6118–6120.
R. Allenspach et al., "Magnetic Domains in Thin Epitaxial Co/Au(111) Films," *Physical Review Letters*, vol. 65, No. 26, Dec. 24, 1990, pp. 3344–3347.

(List continued on next page.)

Primary Examiner—Kevin M. Bernatz
(74) Attorney, Agent, or Firm—Robert P. Lenart, Esq.; Pietragallo, Bosick & Gordon

(57) ABSTRACT

A perpendicular exchange biased device comprises a layer of buffer material on a surface of a substrate, a layer of ferromagnetic material on a surface of the buffer layer, wherein the magnetization of the ferromagnetic layer lies in a direction perpendicular to the plane of the layer of ferromagnetic material, and a layer of antiferromagnetic material on a surface of the layer of ferromagnetic material. A method of making a perpendicular exchange biased device comprising positioning a layer of buffer material on a surface of a substrate, positioning a layer of ferromagnetic material on a surface of the layer of buffer material, wherein the magnetization of the ferromagnetic layer lies in a direction perpendicular to the plane of the layer of ferromagnetic material, and positioning a layer of antiferromagnetic material on a surface of the layer of ferromagnetic material is also included.

30 Claims, 4 Drawing Sheets-

OTHER PUBLICATIONS

B. Dieny et al., "Giant Magnetoresistance in Soft Ferromagnetic Multilayers," *Physical Review B*, vol. 43, No. 1, Jan. 1, 1991, pp 1297–1300.

K. T.–Y. Kung et al., "MnFe Structure–Exchange Anisotropy Relation in the NiFe/MnFe/NiFe System," *J. Appl. Phys.*, vol. 69, No. 8, Apr. 15, 1991, pp 5634–5636.

J. R. Childress et al., "Magnetization, Curie Temperature, and Magnetic Anisotropy of Strained (111) Ni/Au Superlattices," *Physical Review B*, vol. 45, No. 6, Feb. 1, 1992, pp. 2855–2862.

B. G. Demczyk et al., "Growth of Cu Films on Hydrogen Terminated Si(100) and Si(111) Surfaces," *J. Appl. Phys.*, vol. 75, No. 4, Feb. 15, 1994, pp. 1956–1961.

G. Bochi et al., "Evidence for Strong Surface Magnetoelastic Anisotropy in Epitaxial Cu/Ni/Cu(001) Sandwiches," *Physical Review B*, vol. 53, No. 4, Jan. 15, 1996, pp. 1729–1732.

M. T. Johnson et al., "Magnetic Anisotropy in Metallic Multilayers," *Rep. Prog. Phys.*, vol. 59, Jul. 25, 1996, pp. 1409–1458.

B. Újfalussy et al., "First–Principles Calculation of the Anomalous Perpendicular Anisotropy in a Co Monolayer on Au(111)," *Physical Review Letters*, vol. 77, No. 9, Aug. 26, 1996, pp. 1805–1808.

S. H. Charap et al., "Thermal Stability of Recorded Information at High Densities," *IEEE Transactions on Magnetics*, vol. 33, No. 1, Jan. 1997, pp. 978–983.

S. Hope et al., "Thickness Dependence of the Total Magnetic Moment Per Atom in the Cu/Ni/Cu/Si(001) System," *Physical Review B*, vol. 55, No. 17, May 1, 1997, pp. 422–431.

G. Gubbiotti et al., "Perpendicular and In–Plane Magnetic Anisotropy in Epitaxial Cu/Ni/Cu/Si(111) Ultrathin Films," *Physical Review B*, vol. 56, No. 17, Nov. 1, 1997, pp. 073–083.

H. Jiang et al., "Epitaxial Growth of Cu on Si by Magnetron Sputtering," *J. Vac. Sci. Technol. A.*, vol. 16, No. 6, Nov./Dec. 1998, pp. 3376–3383.

A. C. Reilly et al., "Giant Magnetoresistance of Current–Perpendicular Exchange–Biased Spin–Valves of Co/Cu," *IEEE Transactions on Magnetics*, vol. 34, No. 4, Jul. 1998, pp. 939–941.

S. M. Zhou et al., "Exchange Coupling and Macroscopic Domain Structure in a Wedged Permalloy/FeMn Bilayer," *Physical Review B*, vol. 58, No. 22, Dec. 1, 1998, pp. 717–720.

J. Nogues et al., "Exchange Bias," *J. Magn. Magn. Mat.*, vol. 192, 1999, pp. 203–232.

K. Ha et al., "X–Ray Study of Strains and Dislocation Density in Epitaxial Cu/Ni/Cu/Si(001) Films," *Physical Review B*, vol. 60, No. 19, Nov. 15, 1999, pp. 780–785.

G. Lauhoff et al., "Magnetic Anisotropy, Magnetic Moments and Coupling of Cu/Co/Cu/Ni/Cu(001) Trilayer," *J. Phys.: Condens. Matter*, vol. 11, Jun. 8, 1999, pp. 6707–6713.

B. Kagerer et al., "Freezing Field Dependence of the Exchange Bias in Uniaxial $FeF_2$–CoPt Heterosystems With Perpendicular Anisotropy," *Journal of Magnetism and Magnetic Materials*, vol. 217, Mar. 1, 2000, pp. 139–146.

D. A. Thompson et al., "The Future of Magnetic Data Storage Technology," *IBM J. Res. Develop.*, vol. 44, No. 3, May 2000, pp. 311–322.

Z. Lu et al., "Doubly Exchange–Biased FeMn/NiFe/Cu/NiFe/CrMnPt Spin Valves," *IEEE Transactions on Magnetics*, vol. 36, No. 5, Sep. 2000, pp. 2899–2901.

K. Nakamura et al., "Magnetism and Magnetic Anisotropy in FM NiFe, AFM NiMn, and Their Interface," *IEEE Transactions on Magnetics*, vol. 36, No. 5, Sep. 2000, pp. 3269–3271.

X. Liu et al., "Stability of the Perpendicular Magnetic Anisotropy of Ultrathin Ni Films on Cu(100) Upon Multiple Magnetization Reversals," *Physical Review B*, vol. 63, Mar. 16, 2001, pp. 1–4.

N. J. Gökemeijer et al., "Exchange Coupling in Epitaxial CoO/NiFe Bilayers With Compensated and Uncompensated Interfacial Spin Structures," *Physical Review B*, vol. 63, Apr. 9, 2001, pp. 1–4.

C.–H. Lai et al., "Positive Giant Magnetoresistance in Ferrimagnetic/Cu/Ferrimagnetic Films," *J. Appl. Phys.*, vol. 89, No. 11, Jun. 1, 2001, pp. 7124–7126.

S. Maat et al., "Perpendicular Exchange Bias of Co/Pt Multilayers," *Physical Review Letters*, vol. 87, No. 8, Aug. 20, 2001, pp. 1–4.

S. Hameed et al., "Analysis of Disordered Stripe Magnetic Domains in Strained Epitaxial Ni(001) Films," *Physical Review B*, vol. 64, Oct. 2001, pp. 184406–1–184406–6.

S. A. Haque et al., "Perpendicular Magnetic Anisotrophy in Thin Ni Films on GaAs (001)," *Jpn. J. Appl. Phys.*, vol. 41, Part 1, No. 4A, Apr. 2002, pp. 2014–2017.

W. Kuch et al., "Magnetic Interface Coupling in Single–Crystalline Co/FeMn Bilayers," *Physical Review B*, vol. 65, Apr. 4, 2002, pp. 1–4.

* cited by examiner

THIN FILM DEVICE WITH PERPENDICULAR EXCHANGE BIAS

CROSS REFERENCE TO RELATED APPLICATION

This application claims the benefit of U.S. Provisional Patent Application Ser. No. 60/386,997, filed Jun. 7, 2002.

FIELD OF THE INVENTION

This invention relates to magnetic devices, and more particularly to magnetic devices including exchange biased thin films.

BACKGROUND OF THE INVENTION

The pursuit of high areal density magnetic recording toward 100 Gbits/in$^2$ has prompted extensive research in the area of new magnetic materials with perpendicular anisotropy. For thin film fabrication, this becomes a formidable challenge since the magnetostatic energy favors keeping the magnetization in the plane of the film. While attention has focused primarily on recording media, either alloys or multilayer devices, little or no emphasis has been placed on spin valve or tunnel junction devices possessing a perpendicular anisotropy.

Spin valves are widely used as magnetic sensors. Spin valves utilize an antiferromagnetic (AF) layer to pin the direction of magnetization in a ferromagnetic (FM) layer by a phenomenon known as exchange bias. Biasing arises from an interfacial exchange coupling between a FM layer in direct contact with an AF layer. The exchange bias effect is easily observed from the hysteresis loop being offset from zero field by an amount known as the exchange field ($H_E$) together with an increase in the coercivity ($H_C$). Since its discovery over 40 years ago, exchange bias has since been observed in a number of magnetic bilayer systems. A key to understanding the nature of this effect is the interfacial spin device in both the FM and AF layers. However, despite all the experimental and theoretical work to date, the exchange bias effect remains unresolved.

There is one common approach to all exchange coupled AF/FM bilayer studies; that is, the magnetization of the FM layer is confined to lie in the plane of the film. Recently it was shown that perpendicular exchange bias can be observed in a (Co/Pt) multilayer grown on an AF FeF$_2$ substrate. At low temperatures, a shifted hysteresis loop has been observed similar to the in-plane exchange bias systems with the distinction that the magnetic field is applied normal to the substrate plane. Subsequently other studies were also reported using the same type of (Co/Pt) multilayer with an oxidized Co capping layer, where CoO is the AF layer. These examples introduced a novel experimental approach to the exchange bias problem and shed new light on the nature of the spin device between the FM and AF layers. However, in those two studies the FM component was made up of a rather complex multilayer device where aside from the exchange bias effect, a different type of interfacial exchange coupling between the Co and Pt layers is also present.

There are numerous thin film ferromagnets that possess a perpendicular anisotropy. In these cases, the FM layer exhibits a spin reorientation effect due to distortion of the crystal lattice by epitaxial growth on an appropriate underlying substrate. Some common examples are Co/Au (111) and Ni/Cu (002). Ni on Cu is one of the most widely studied systems having many salient features that are ideal for an exchange bias study. Fundamentally, Ni films greater than 20 Å thick are magnetic at room temperature and the perpendicular anisotropy has been shown to extend over a 100 Å range. $H_C$ values less than 50 Oe have also been reported for films less than 40 Å thick.

A device with the magnetization normal to the substrate plane may offer new and attractive features for magnetic field detection. Thus this invention provides a perpendicular exchange bias device that can be used for magnetic field detection.

SUMMARY OF THE INVENTION

Perpendicular exchange biased device constructed in accordance with the invention comprise a layer of buffer material on a surface of a substrate, a layer of ferromagnetic material on a surface of the buffer layer, wherein the magnetization of the ferromagnetic layer lies in a direction perpendicular to the plane of the layer of ferromagnetic material, and a layer of antiferromagnetic material on a surface of the layer of ferromagnetic material.

The buffer material can comprise a material selected from the group of copper and diamond. The layer of ferromagnetic material can comprise a material selected from the group of nickel or an alloy containing nickel. The layer of antiferromagnetic material can comprise a manganese-based alloy, for example FeMn.

The buffer material can alternatively comprise (002) copper or (001) diamond. The diamond can be boron-doped diamond or nitrogen doped diamond.

The invention also encompasses a method of making a perpendicular exchange biased device comprising positioning a layer of buffer material on a surface of a substrate, positioning a layer of ferromagnetic material on a surface of the layer of buffer material, wherein the magnetization of the ferromagnetic layer lies in a direction perpendicular to the plane of the layer of ferromagnetic material, and positioning a layer of antiferromagnetic material on a surface of the layer of ferromagnetic material.

The buffer material comprises a material selected from the group of copper and diamond. The layer of ferromagnetic material can comprise a material selected from the group of nickel or an alloy containing nickel. The layer of antiferromagnetic material can comprise a manganese-based alloy, for example FeMn.

The buffer material can comprise (002) copper or (001) diamond. The diamond can be a boron-doped diamond or a nitrogen doped diamond.

The step of positioning a layer of ferromagnetic material on a surface of the layer of buffer material can comprise the step of epitaxially growing the layer of ferromagnetic material on the surface of the layer of buffer material.

DETAILED DESCRIPTION OF THE INVENTION

Figure 1:
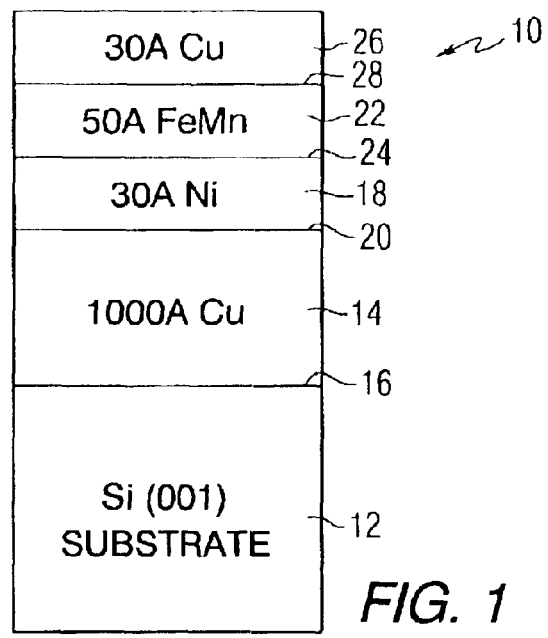
FIG. 1 is a schematic view of the bilayer device constructed in accordance with this invention.

Referring to the drawings, FIG. 1 is a schematic view of a bilayer device 10 constructed in accordance with this invention. The device includes a substrate 12, which can be for example (001) silicon. A layer 14 of copper is shown to be positioned on a surface 16 of the substrate. In one example, the copper is an ordered face centered cubic layer. A layer 18 of nickel is positioned on a surface 20 of the copper layer. A small difference in crystal lattice between the nickel layer and the copper layer produces a perpendicular magnetization in the nickel. A layer 22 of iron manganese (FeMn) is positioned on a surface 24 of the layer of nickel. Face centered cubic (fcc) Ni provides a suitable template for the growth of the FeMn layer. A second layer 26 of copper is positioned on a surface 28 of the layer of iron manganese to prevent oxidation of the multilayer stack.

Figure 2:
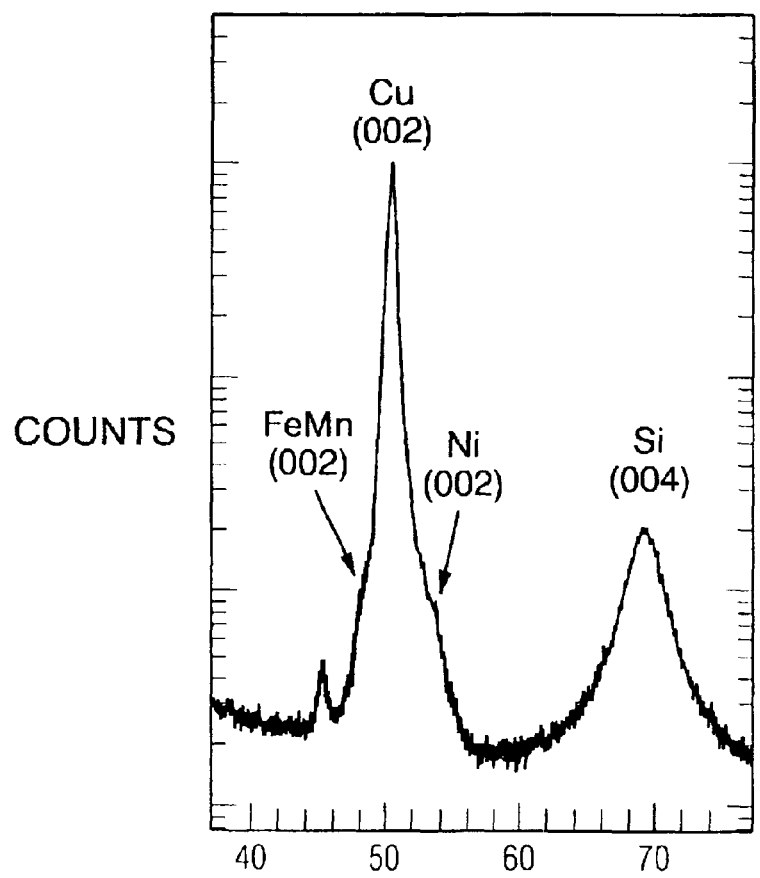
FIG. 2 is an x-ray diffraction spectrum for the device of FIG. 1.

FIG. 2 is an x-ray diffraction spectrum for the device of FIG. 1, showing the highly oriented (002) direction crystal. As seen from the x-ray diffraction spectrum the Cu buffer layer exhibits a single crystal-like texture along the [002] direction. Superimposed on this peak are the Ni and FeMn layers. Since the bulk lattice parameters for Cu, Ni and FeMn are 3.62 Å, 3.52 Å and 3.64 Å respectively, the Ni peak is observed at a slightly higher 2θ value and the FeMn peak at a slightly lower 2θ value as compared to Cu. Phi scans show a four-fold symmetry further suggesting a high crystal quality sample. The 3% lattice mismatch between the Cu and Ni layers establishes perpendicular magnetization ($M_\perp$) in the Ni layer.

Samples having the structure of the device of FIG. 1 have been fabricated by dc magnetron sputtering in 3 mTorr Ar onto HF etched Si (001) substrates. However, any thin film preparation technique such as evaporation, molecular beam epitaxy and laser ablation would suffice as well. A 1000 Å Cu buffer layer was first grown on an HF etched Si (001) wafer to promote a necessary (002) texture for the epitaxial growth of strained Ni in accordance with known techniques. Using the Cu buffer layer, two types of bilayer films with Ni layers varying in thickness from 30 to 100 Å were grown for comparison. The Ni layers were capped with 50 Å FeMn and 30 Å Cu. An additional sample containing a pure Ni layer capped with 30 Å Cu was also constructed.

Figure 3:
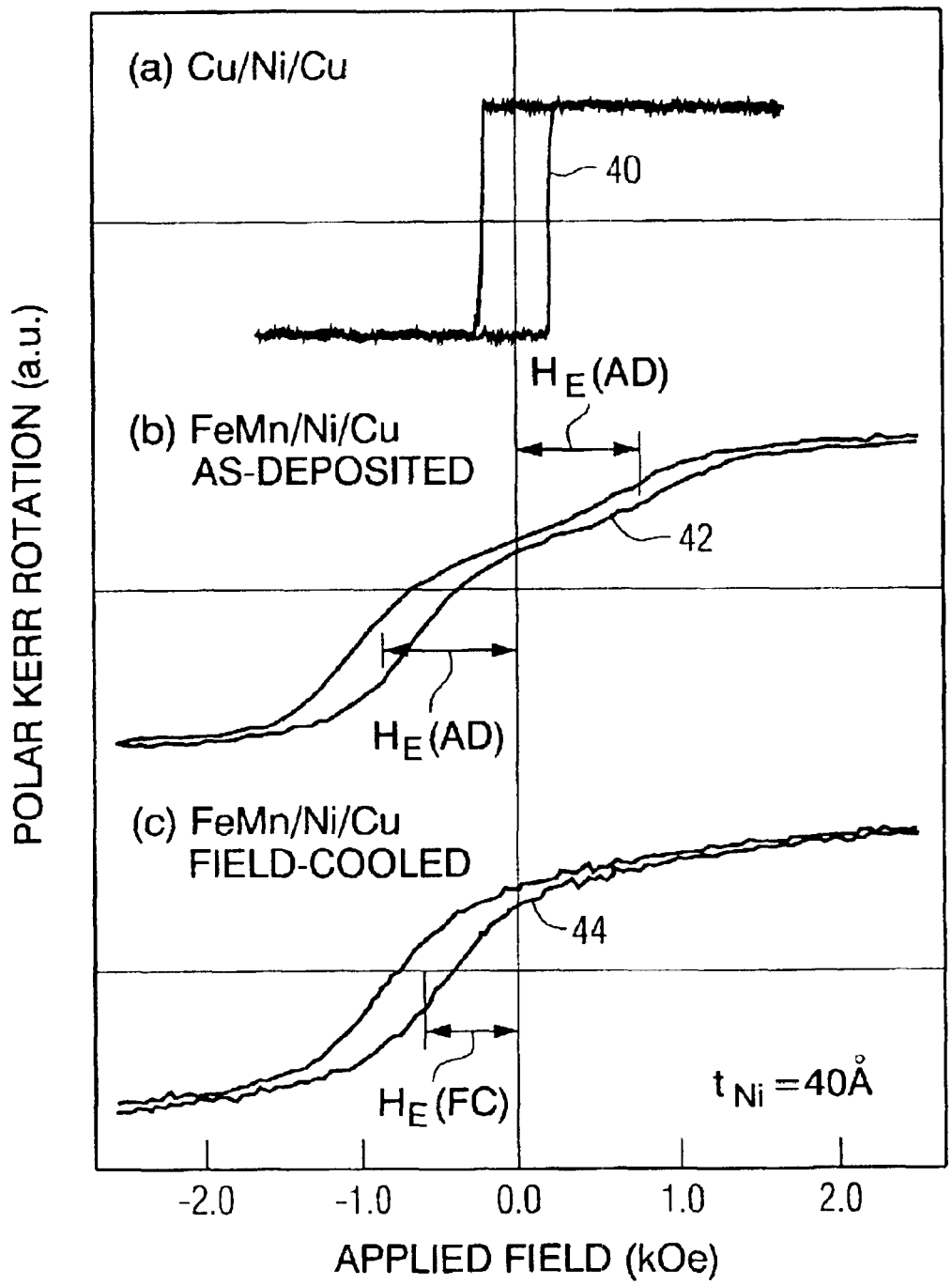
FIG. 3 shows several hysteresis curves for various examples of bilayer devices on a copper layer.

FIG. 3 shows hysteresis curves for the various layered device samples. Loop 40 is a hysteresis curve for a 40 Å pure Ni film on a copper layer with a copper cap. Loop 42 is a hysteresis curve for a 50 Å FeMn/40 Å Ni bilayer as-deposited on a copper layer. Loop 44 is a hysteresis curve for a 50 Å FeMn/40 Å Ni bilayer field cooled from 150° C. in 2 kOe. As-deposited films were grown in the absence of a magnetic field. Field cooled films were heated to a temperature above $T_N$ of the FeMn and cooled to room temperature in the presence of a 2 kOe magnetic field.

The hysteresis loops of FIG. 3 were taken at room temperature using a polar magneto-optic Kerr effect (MOKE) measurement for a set of 40 Å thick Ni films where the applied magnetic field ($H_{APPL}$) was normal to the substrate plane. As shown in loop 40 the pure Ni film exhibits a square loop with a $H_C$ value around 200 Oe that is larger than previously reported in evaporated Ni/Cu of the same thickness. Differences in growth pressure and the energetics of sputtering as compared to evaporation may have slightly altered the magnetic properties. Hysteresis loops obtained in the as-deposited and field cooled (2 kOe from 150° C.) exchange bias samples are shown as loops 42 and 44. From loop 44, it is clear that exchange bias perpendicular to the film plane is observed in the FeMn/Ni bilayer. The hysteresis loop is shifted by almost 600 Oe from zero field. This magnitude of $H_E$ is comparable to values measured by others in FeMn/NiFe bilayers of the approximately the same thickness. The hysteresis curve is no longer square but rather skewed in comparison to the pure Ni film in loop 40. For most exchange bias systems when $H_{APPL}$ is parallel to the unidirectional (UD) anisotropy axis, the hysteresis curves have a high degree of squareness since the FM layer is set to a single domain state when the bilayer is cooled in a large magnetic field across $T_N$. For the bilayers of this invention the FM layer is clearly not single domain, possibly due to the large induced strain at the Ni/Cu interface that has been shown previously to affect exchange bias. Furthermore, the saturation field has increased considerably suggesting an in-plane magnetization component.

A much more complicated hysteresis loop 42, is observed in the as-deposited sample since $T_N$ of FeMn is above room temperature. The hysteresis curve shows distinct features where one portion of the loop is shifted to the right and one portion of the loop is shifted to the left. We define a new exchange field for the as-deposited sample, $H_E$(AD), in the exchange coupled bilayer. The magnitude of $H_E$(AD) for the loop shift to both the right and the left is equivalent. This suggests that the Ni layer is multi-domain where the magnetization points in the opposite direction but still remains normal to the plane of the film. Furthermore, the spin arrangement of the magnetic domains has been locked in place by the exchange coupling with the FeMn layer. It should be noted that stripe domains have peviously been observed in thin Ni layers on Cu from Magnetic Force Microscopy (MFM) images where the domain device has been shown to vary with the Ni layer thickness. Our results are in agreement with that work offer yet another way to observe the domain device in thin Ni layers using magnetometry. The hysteresis curves for the as-deposited sample were also similar to curves previously observed by others in de-magnetized zero field cooled exchange biased NiFe/CoO where the NiFe is also in a multi-domain state.

The exchange biased hysteresis curves shown in FIG. 3 clearly indicate that the magnetization vector can point along three well-defined directions when the magnetic field and the unidirectional anisotropy axis is perpendicular to the film plane. We identify two directions where the magnetization vector lies normal to the film plane designated as up out of the plane ($M_{\perp\uparrow}$) and as down into the plane ($M_{\perp\downarrow}$). The third direction is the magnetization vector lying in the plane ($M_{\leftrightarrow}$). Since polar magnetometry only measures the out of the plane component, the direction of the in-plane magnetization along a specific crystallographic axis is irrelevant. Therefore the magnetization vectors pointing either up or down contribute to the loop shift while the in-plane magnetization increases the saturation field. The amount of each domain configuration depends upon the balance between magnetostatic, perpendicular, domain wall and interface exchange energies. These energy contributions will change as a function of both the FM and AF layer thickness resulting in different shaped hysteresis curves.

Figure 4:
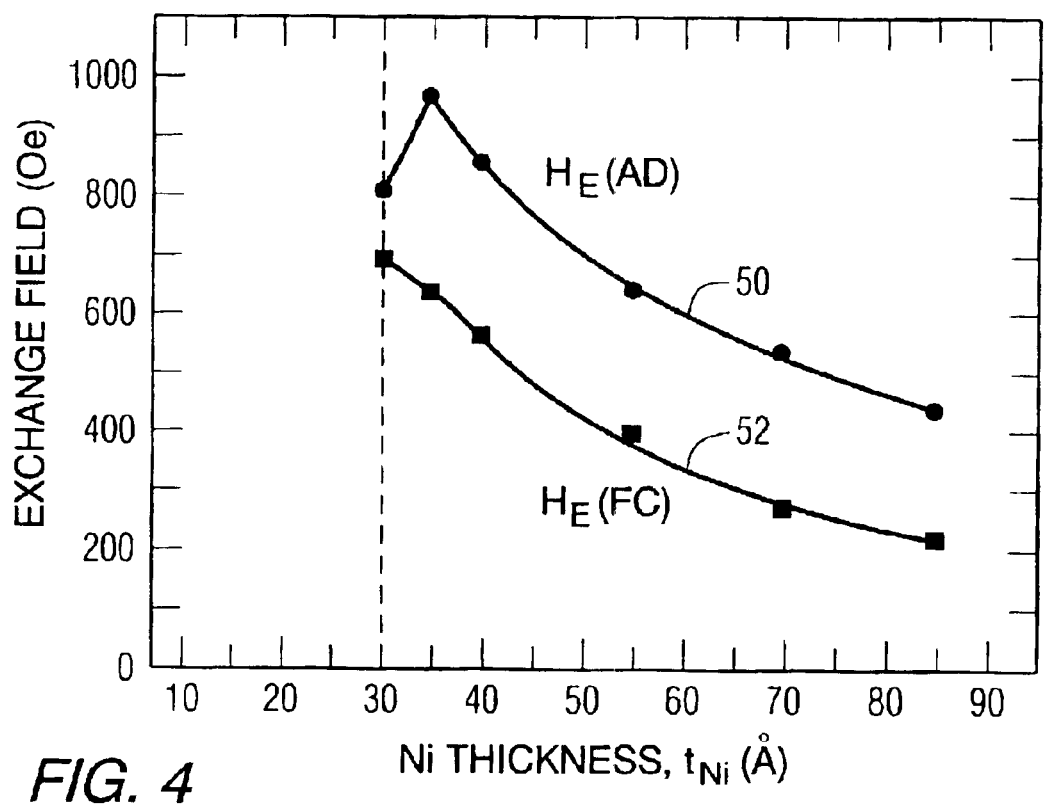
FIG. 4 is a graph of the exchange fields for the as-deposited and field cooled biased samples.

The application of a large magnetic field during cooling across $T_N$ modifies the domain configuration in the FM layer and will change the exchange bias outcome. In FIG. 4 the exchange field for the as-deposited and field cooled, $H_E$(FC), samples are shown as a function of the Ni layer thickness. Curve 50 represents the exchange field for the as-deposited samples. Curve 52 represents the exchange field for the field-cooled samples. Two pronounced features are observed from this data. First, in both cases $H_E$(AD) and $H_E$(FC) follow a $1/t_{N1}$ behavior where $t_{N1}$ is the FM layer thickness. This familiar surface effect has been previously shown in many of the in-plane exchange bias systems. Secondly, the loop shift for the as-deposited sample is always larger than the loop shift for the field cooled sample. We have measured no apparent difference in the bilayer device before and after field annealing and only the domain configuration in the FM layer has been modified. Over a constant exchange area, the multi-domains coalesce into a smaller number of domains upon the application of a large magnetic field. It is clear that the size and the number of FM spins in the magnetic domains affect the magnitude of the loop shift. It should also be noted that the maximum field available for our experiments is only 2 kOe which is less than the $4\pi Ms$ value of Ni (~6 kOe). While the larger field would be able to set all the Ni spins in the same direction, it is unclear whether this would account for the difference between $H_E$(AD) and $H_E$(FC) since both have a similar domain device.

Figure 5:
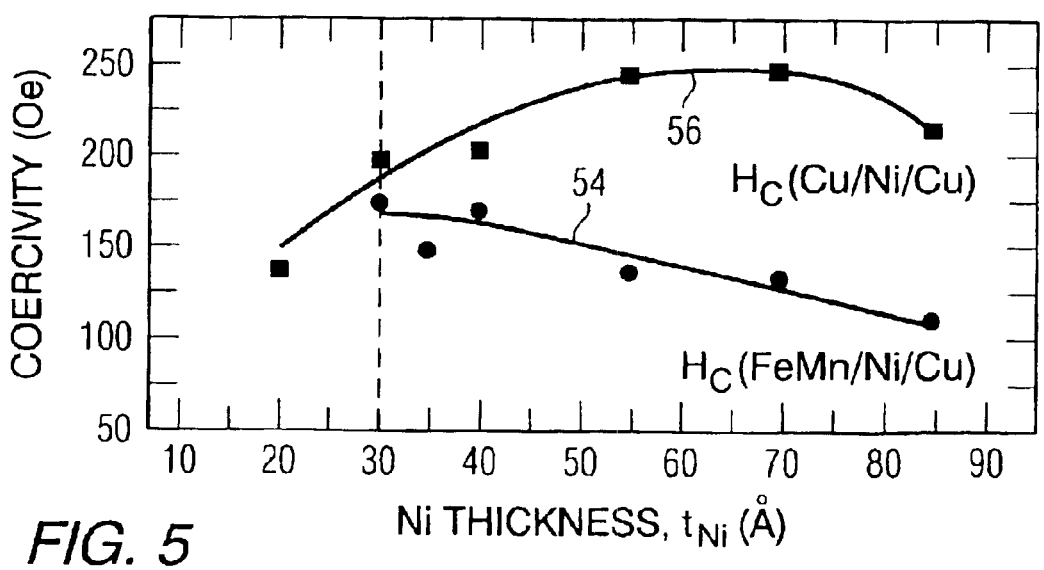
FIG. 5 is a graph of the coercivity for pure Ni and biased samples as a function of Ni thickness.

The coercivity in the exchange bias bilayers of this invention also has a unique FM layer thickness dependence. The coercivity values for the pure Ni films, $H_C$ (Cu/Ni/Cu), and the exchange bias bilayers, $H_C$ (FeMn/Ni/Cu), with respect to the Ni layer thickness are shown in FIG. 5. In contrast to the in-plane exchange bias systems, the $H_C$ value is lower in the exchanged biased FeMn/Ni bilayer as illustrated by curve 54 as compared to the pure Ni film for a set Ni thickness, as illustrated by curve 56. We attribute the smaller $H_C$ values in the exchange bias films to the in-plane magnetization component, $M_\leftrightarrow$, in the FM layer from angular dependence measurements of the exchange bias. As the Ni layer thickness increases, a predominant in-plane magnetization will result in a smaller coercivity as compared to the pure Ni film without exchange bias. This trend is shown in FIG. 5 where $H_C$ is smallest for the thickest Ni film. In the films of this invention, below a thickness of 30 angstroms as shown by the dashed line in FIG. 5, the Ni is in a single domain state where the magnetization lies normal to the film plane without the presence of any in-plane magnetization component.

We have described the fabrication and analysis of a simple bilayer device of FeMn/Ni epitaxially grown on a Cu (200) buffer that exhibits an exchange bias effect only when the external magnetic field is applied perpendicular to the film plane. The observed perpendicular exchange bias effect is unique for this system because of the bilayer growth on an appropriate buffer layer which dictates that the magnetization of the ferromagnetic layer lies perpendicular to the film plane. Without the Cu (200) buffer, the FeMn/Ni bilayer device will exhibit the commonly found in-plane exchange bias effect. The choice of Ni provides many important features such as low coercivity over a large thickness range and a suitable template for most Mn-based AF layers such as RhMn, PtMn and IrMn, thereby allowing easy incorporation into current device architectures.

In one example, the invention encompasses a perpendicular exchange bias device at room temperature including a FeMn/Ni bilayer grown on a Cu (002) buffer where the magnetization and the applied magnetic field are normal to the film plane. A unique feature of this bilayer device is the Cu (200) buffer layer and the subsequent epitaxial growth of slightly strained Ni which possesses a perpendicular anisotropy. The magnitude of $H_E$ is shown to be strongly dependent upon the ferromagnetic domain size in the Ni layers and $H_C$ is shown to be smaller in the exchange bias films as compared to pure Ni films.

The devices of this invention use a bilayer device including a ferromagnet with perpendicular anisotropy along with a suitable antiferromagnet, for room temperature exchange bias. The ferromagnetic material can either be pure Ni or a Ni-based alloy such as $Ni_{95}Co_5$.

A key feature for obtaining the perpendicular magnetization is the epitaxial growth of the FM layer on an appropriate substrate. In one example Cu (200) can be grown on HF etched Si (001), however there are other suitable buffer layers and substrate candidates. In particular diamond (C) substrates with a (001) crystal orientation are commercially available and will provide a template similar to Cu (002). Furthermore diamond films grown on Si (001) would also be suitable buffer layers for the Ni based alloy films. The C (001) substrate is appealing since it can be doped as an insulator with nitrogen or doped as a conductor with boron. This allows for specific transport configurations to be used. For example when using the Current Perpendicular to the Plane (CPP) configuration, a conducting C (001) substrate facilitates connection to a bottom contact. On the other hand, an insulating C (001) substrate is ideal for the Current In Plane (CIP) configuration eliminating current shunting from a thick Cu layer. The AF layer can be a Mn-based alloy which will exert a minimal amount of stress on the FM layer without destroying the perpendicular anisotropy. The suggested bilayer device can be used for fabricating a spin valve sensor with magnetization perpendicular to the film plane.

We have constructed samples showing a perpendicular exchange bias at room temperature in a series of FeMn/Ni bilayers grown on Cu (002), where the magnetization and the applied magnetic field are normal to the film plane. Distinct features in the hysteresis loops of the as deposited samples suggest a multi-domain type device in the thin Ni layers which is locked in place due to the exchange coupling with the FeMn layer. Loop shifts on the order of 1 kOe have been measured in the as-deposited samples but decrease when the bilayers are field cooled from high temperature. The loop shifts are also shown to vary inversely with the Ni layer thickness while the coercivity decreases in the exchange coupled samples as compared to pure Ni films. The bilayer device described here can be utilized and incorporated into numerous reader devices and media applications for magnetic recording.

The bilayer with perpendicular anisotropy preferably includes a FM layer with a high Curie temperature ($T_C$) as well as an AF layer with a high Neel temperature ($T_N$) so that room temperature hysteresis measurements can be made. For a spin valve device both $T_C$ and $T_N$ should be higher than the device operating temperature and in most exchange bias systems $T_C$ is always higher than $T_N$. Furthermore, the choice of the FM layer should have a large thickness range where the magnetization is normal to the film plane and a relatively small coercivity to facilitate observation of the exchange bias effect, i.e. the loop shift. The FM layer should further provide a template for the AF capping layer.

Figure 6:
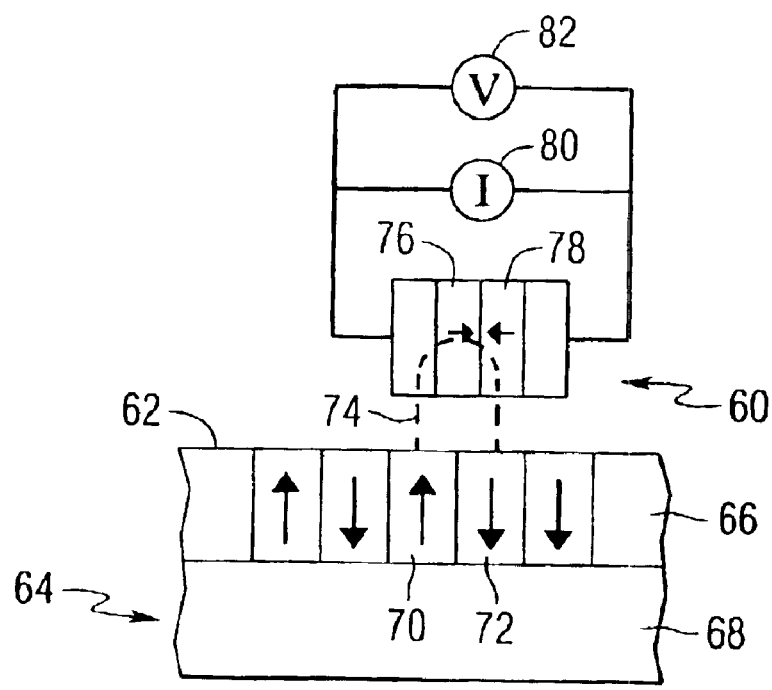
FIGS. 6 and 7 are schematic views of a device constructed in accordance with this invention in combination with a portion of a perpendicular recording medium.
Figure 7:
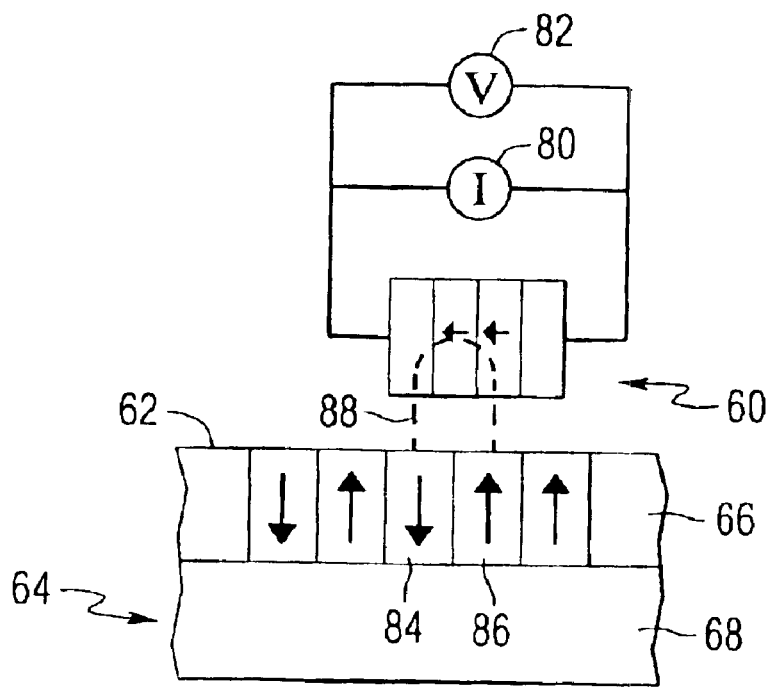

The bilayer device of this invention can be an integral part of a spin valve device with perpendicular anisotropy. FIGS. 6 and 7 are schematic representations of a device constructed in accordance with this invention as part of a spin valve sensor in combination with a portion of a perpendicular recording medium. In FIG. 6, a sensor 60 is shown to be positioned near a surface 62 of a perpendicular magnetic storage medium 64. The magnetic storage medium includes a magnetically hard layer 66 on a magnetically soft layer 68. The magnetically hard layer 66 includes a plurality of bits, for example 70 and 72, wherein the direction of magnetization of the bits is representative of digital information stored on the medium. In FIG. 6, the magnetization of bits 70 and 72 produces a fringing magnetic field 74 that causes the magnetization of the ferromagnetic layer 76 to align with the fringing field. Thus the magnetization of the ferromagnetic layer is in a direction opposite to the magnetization of the pinned layer 78. A current source 80 is connected to the device to pass a current through the device in a direction perpendicular to the plane. The relative direction of the magnetization of the ferromagnetic layer and the pinned layer affects the resistance of the device which changes the voltage across the device as sensed by voltage detector 82.

In FIG. 7, the magnetization of bits 84 and 86 produces a fringing magnetic field 88 that causes the magnetization of the ferromagnetic layer 76 to align with the fringing field. In this case, the magnetization of the ferromagnetic layer is in the same direction as the magnetization of the pinned layer 78. This produces a different voltage across the device. As the medium moves relative to the sensor, the information stored in the medium can be read as a series of voltages across the sensor.

To date almost all exchange bias studies have the magnetization lying in the film plane. Our bilayer device offers a simple approach to the exchange bias effect in an uncharacteristic way. However, while the magnetization lies perpendicular to the film plane, the perpendicular exchange bias effect exhibits many features similar to the in-plane exchange bias effect. For perpendicular exchange bias, $H_E$ also varies inversely with the ferromagnetic layer thickness thereby offering a tunable range over which the biasing effect can be adjusted.

Using the simple bilayer device describe above, a complete spin valve sensor can be realized. This perpendicular sensor will have many advantages over an in-plane sensor. Using the current read head device and media geometry, a spin valve sensor with perpendicular anisotropy will be able to detect the downtrack stray field component from the recording media. As the areal recording density increases to higher values as expected using perpendicular recording media, the usefulness of this type of spin valve will become of great importance. Furthermore, for an in-plane spin valve of small dimensions, the demagnetization field can cause non-uniform magnetization throughout the device especially along the boundaries. In the perpendicular spin valve this is no longer an issue and there is no need for hard biasing magnets that will simplify the device fabrication.

While the present invention has been described in terms of several examples, it will be apparent to those skilled in the art that various changes can be made to the disclosed examples without departing from the scope of the invention as defined by the following claims.

What is claimed is:

1. A perpendicular exchange biased device comprising:
   a layer of buffer material on a surface of a substrate,
   a layer of ferromagnetic material on a surface of the buffer layer, wherein the magnetization of the ferromagnetic layer lies in a direction perpendicular to the plane of the layer of ferromagnetic material; and
   a layer of antiferromagnetic material directly deposited on a surface of the layer of ferromagnetic material.

2. A device according to claim 1, wherein the buffer material comprises a material selected from the group of:
   copper and diamond.

3. A device according to claim 2, wherein the layer of ferromagnetic material comprises a material selected from the group of:
   nickel or an alloy containing nickel.

4. A device according to claim 3, wherein the layer of antiferromagnetic material comprises a manganese-based alloy.

5. A device according to claim 4, wherein the manganese-based alloy is selected from the group of: FeMn, RhMn, PtMn and IrMn.

6. A device according to claim 1, wherein the buffer material comprises a (002) copper.

7. A device according to claim 1, wherein the buffer material comprises a (001) diamond.

8. A device according to claim 1, wherein the buffer material comprises one of: boron doped diamond or nitrogen doped diamond.

9. A method of making a perpendicular exchange biased device comprising:
   positioning a layer of buffer material on a surface of a substrate,
   positioning a layer of ferromagnetic material on a surface of the layer of buffer material, wherein the magnetization of the ferromagnetic layer lies in a direction peipendicular to the plane of the layer of ferromagnetic material; and
   directly depositing a layer of antiferromagnetic material on a surface of the layer of ferromagnetic material.

10. The method of claim 9, wherein the buffer material comprises a material selected from the group of:
    copper and diamond.

11. The method of claim 10, wherein the layer of ferromagnetic material comprises a material selected from the group of:
    nickel or an alloy containing nickel.

12. The method of claim 11, wherein the layer of antiferromagnetic material comprises a manganese-based alloy.

13. The method of claim 12, wherein the manganese-based alloy is selected from the group of: FeMn, RhMn, PtMn and IrMn.

14. The method of claim 9, wherein the buffer material comprises a (002) copper.

15. The method of claim 9, wherein the buffer material comprises a (001) diamond.

16. The method of claim 9, wherein the buffer material comprises one of: boron doped diamond or nitrogen doped diamond.

17. The method of claim 9, wherein the step of positioning a layer of ferromagnetic material on a surface of the layer of buffer material, comprises the step of:
    epitaxially growing the layer of ferromagnetic material on the surface of the layer of buffer material.

18. A perpendicular exchange biased device comprising:
    a carbon based layer of buffer material on a surface of a substrate,
    a layer of ferromagnetic material on a surface of the buffer layer, wherein the magnetization of the ferromagnetic layer lies in a direction perpendicular to the plane of the layer of ferromagnetic material; and
    a layer of antiferromagnetic material on a surface of the layer of ferromagnetic material.

19. A device according to claim 18, wherein the layer of ferromagnetic material comprises a material selected from the group of:
    nickel or an alloy containing nickel.

20. A device according to claim 19, wherein the layer of antiferromagnetic material comprises a manganese-based alloy.

21. A device according to claim 20, wherein the manganese-based alloy is selected from the group of: FeMn, RhMn, PtMn and IrMn.

22. A device according to claim 18, wherein the buffer material comprises a (001) diamond.

23. A device according to claim 18, wherein the buffer material comprises one of: boron doped diamond or nitrogen doped diamond.

24. A method of making a perpendicular exchange biased device comprising:

positioning a carbon based layer of buffer material on a surface of a substrate, positioning a layer of ferromagnetic material on a surface of the layer of buffer material, wherein the magnetization of the ferromagnetic layer lies in a direction perpendicular to the plane of the layer of ferromagnetic material; and positioning a layer of antiferromagnetic material on a surface of the layer of ferromagnetic material.

25. The method of claim 24, wherein the layer of ferromagnetic material comprises a material selected from the group of:

nickel or an alloy containing nickel.

26. The method of claim 25, wherein the layer of antiferromagnetic material comprises a manganese-based alloy.

27. The method of claim 26, wherein the manganese-based alloy is selected from the group of: FeMn, RhMn, PtMn and IrMn.

28. The method of claim 24, wherein the buffer material comprises a (001) diamond.

29. The method of claim 24, wherein the buffer material comprises one of: boron doped diamond or nitrogen doped diamond.

30. The method of claim 24, wherein the step of positioning a layer of ferromagnetic material on a surface of the layer of buffer material, comprises the step of:

epitaxially growing the layer of ferromagnetic material on the surface of the layer of buffer material.

* * * * *

UNITED STATES PATENT AND TRADEMARK OFFICE
CERTIFICATE OF CORRECTION

PATENT NO. : 6,835,464 B2
APPLICATION NO. : 10/251278
DATED : December 28, 2004
INVENTOR(S) : Thomas F. Ambrose et al.

It is certified that error appears in the above-identified patent and that said Letters Patent is hereby corrected as shown below:

<u>Title Page, Item (56) References Cited,</u>
Other Publications (column 2)
After "Magnetic", change "Anisotrophy" to read "Anisotropy".

Page 2
Other Publications (column 2)
After "Magnetic", change "Anisotrophy" to read "Anisotropy".

Column 5, Line 1
After "follow a", change "$1/t_{N1}$" to read "$1/t_{Ni}$".

Column 5, Line 1
After "where", change "$1/t_{N1}$" to read "$1/t_{Ni}$".

Column 5, Line 14
After "the", change "$4\pi MS$" to read "$4\pi M_S$".

Signed and Sealed this

Eighth Day of August, 2006

JON W. DUDAS
*Director of the United States Patent and Trademark Office*